United States Patent [19]

Stevens

[11] Patent Number: 4,942,312

[45] Date of Patent: Jul. 17, 1990

[54] INTEGRATED-CIRCUIT HAVING TWO NMOS DEPLETION MODE TRANSISTORS FOR PRODUCING STABLE DC VOLTAGE

[75] Inventor: Eric G. Stevens, Rochester, N.Y.

[73] Assignee: Eastman Kodak Company, Rochester, N.Y.

[21] Appl. No.: 766,994

[22] Filed: Aug. 19, 1985

[51] Int. Cl.[5] ...................... H03K 3/013; H03K 17/16; H03K 19/003; H02P 7/06

[52] U.S. Cl. .................................. 307/296.8; 307/304; 307/475; 307/572; 323/224; 323/225; 323/226

[58] Field of Search ........... 307/304, 475, 297, 296 R, 307/572; 323/224, 225, 226

[56] References Cited

U.S. PATENT DOCUMENTS

| | | | |
|---|---|---|---|
| 2,747,158 | 5/1956 | Le Bel | 323/224 X |
| 3,532,899 | 10/1970 | Huth et al. | 307/572 |
| 3,586,883 | 6/1971 | Hayes | 307/304 X |
| 3,636,378 | 1/1972 | Chashi et al. | 307/304 X |
| 3,771,043 | 11/1973 | Zulaski | 323/226 X |
| 3,839,646 | 10/1974 | Soloway | 307/304 X |
| 4,001,612 | 1/1977 | Aoki et al. | 307/304 |
| 4,011,471 | 3/1977 | Rockett, Jr. | 307/304 |
| 4,135,125 | 1/1979 | Oura | 323/22 R |
| 4,336,466 | 6/1982 | Sud et al. | 307/304 |
| 4,451,744 | 5/1984 | Adam | 307/304 |
| 4,499,416 | 2/1985 | Koike | 323/303 |

FOREIGN PATENT DOCUMENTS

| | | | |
|---|---|---|---|
| 1263850 | 3/1968 | Fed. Rep. of Germany | 323/226 |

OTHER PUBLICATIONS

Capella, "FETs as Voltage Controlled Resistors", Siliconix application notes, pp. 1-12, Feb. 1973.

Keefe, "Transformer and Shunt Transistors Regulate Power Supply", pp. 99-101, May 1961.

Hargrave, "Commutating and Interfacing with Junction and MOSFETs", Electronic Engineering, pp. 56-59, Dec. 1969.

*Primary Examiner*—Stanley D. Miller

*Assistant Examiner*—David R. Bertelson

*Attorney, Agent, or Firm*—Raymond L. Owens

[57] ABSTRACT

An integrated-circuit including two NMOS depletion mode transistors having parameters selected so that when the transistors are connected in accordance with the invention (see FIG. 1), the circuit in response to a variable input DC voltage produces a stable DC output voltage.

6 Claims, 1 Drawing Sheet

INTEGRATED-CIRCUIT HAVING TWO NMOS DEPLETION MODE TRANSISTORS FOR PRODUCING STABLE DC VOLTAGE

BACKGROUND OF THE INVENTION

1. Field of the Invention

This invention relates to integratedcircuits which in response to a variable DC input voltage produce a stable output DC voltage.

2. Description of the Prior Art

There are a variety of applications where stable DC reference voltages are needed. For example, charge-coupled (CCD) devices often require five or six stable DC voltages. In CCD devices, these voltages operate gate electrodes and a reset gate which resets the floating diffusion of an output diode. Often these voltages are provided by off-chip circuitry. For purpose of this disclosure, when an electrical circuit is fabricated on or within a substrate, it will be referred to as an integrated-circuit. A chip includes a substrate and all the electrical circuits fabricated on it. Off-chip circuits generally add to the overall system cost and complexity while reducing system reliability. There are a number of advantages for providing an integrated-circuit for producing a stable DC voltage. Unfortunately, such circuits can include a number of active elements and consume a relatively large amount of chip area.

The object of this invention is to provide an integrated-circuit for producing a stable DC voltage and which can be used on-chip and which uses very little chip area and consumes a relatively small amount of power.

SUMMARY OF THE INVENTION

This object is achieved by an integrated-circuit which in response to a variable DC input voltage produces a stable DC voltage. The circuit includes first and second NMOS depletion mode transistors. Each transistor has gate drain and source electrodes. These electrodes are electrically connected as follows: the source and drain electrodes of the first and second transistors respectively, are connected. The first transistor's gate electrode and the second transistor's source and gate electrodes are connected to a reference potential. The drain electrode of the first transistor is connected to the variable input voltage. A stable DC output voltage is produced at the electrical junction of the connected source and drain electrodes.

Among the features of this integrated-circuit are that it has low power dissipation, requires very little surface area and is quite versatile.

This circuit reduces needed external components and also increases reliability, noise immunity and simplicity of overall system design.

DESCRIPTION OF THE PREFERRED EMBODIMENT

Figure 1:
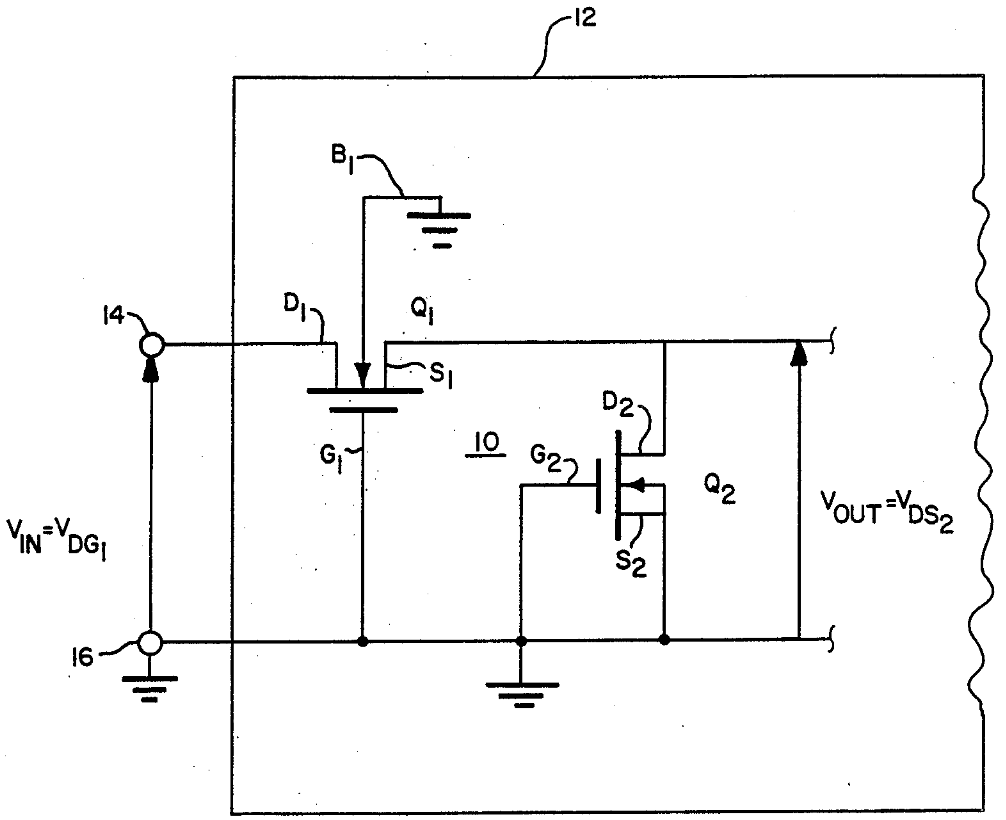
FIG. 1 is a schematic diagram of an on-chip integrated-circuit having two NMOS depletion mode transistors connected in accordance with the present invention.

As shown in FIG. 1, an integrated-circuit 10 is provided on a silicon chip 12. The chip 12 includes other active elements which may comprise, for example, a CCD image sensor (not shown). Two pins 14 and 16 provide a connection to an external power supply shown as $V_{IN}$. It should be noted that pin 16 is at a reference potential (ground). The circuit 10 includes only two active elements; NMOS depletion mode transistors $Q_1$ and $Q_2$. Each of these transistors includes a gate (G), a source (S) and a drain (D) electrode. The silicon substrate bulk electrode (B) under each of these transistors is connected to ground.

The source electrode $S_1$ of transistor $Q_1$ is connected to the drain $D_2$ of transistor $Q_2$ The gate electrodes $G_1$ and $G_2$ and the source electrode $S_2$ are also connected to ground. $V_{IN}$ (relative to ground) is applied to electrode $D_1$. The output voltage $V_{OUT}$ is produced at the electrical junction of the source electrode $S_1$ and the drain electrode $D_2$.

Figure 2:
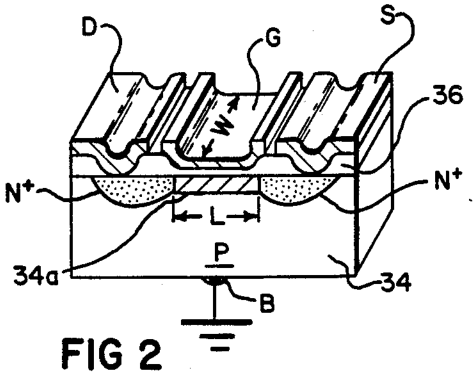
FIG. 2 is a perspective, not to scale, of a NMOS depletion mode transistor which can be used in the integrated-circuit shown in FIG. 1.

Turning now to FIG. 2, an NMOS depletion mode transistor which can be used as $Q_1$ or $Q_2$ in circuit 10 of FIG. 1, is shown to be constructed on a silicon semiconductor substrate 34 of the chip 12. A silicon dioxide ($SiO_2$) insulating layer 36 overlies the substrate 34. Silicon dioxide has the property of preventing the diffusion of impurities through it and is an excellent insulator. Aluminum conductive electrodes provide the gate (G), drain (D) and source (S) electrodes and are deposited on top of the layer 36 as shown. Masking and etching processes are used to remove the undesired aluminum in the process of forming these electrodes. A polysilicon conductive layer can also be used for the gate electrode (G).

The bulk of the substrate 34 has been doped to be a p-type substrate. A suitable p-type dopant is boron. An n-type layer *34a* has been diffused into the bulk substrate to define an actual channel. Suitable n-type materials are arsenic and phosphorus. The length of the diffusion layer *34a* or channel is L and the width of the diffusion layer *34a* or channel is W. The channel width is perpendicular to the channel length L. As will be discussed later, the parameters W and L of each transistor are important in providing the output voltage.

The threshold voltage $V_T$ is that minimum voltage applied to the gate electrode which causes the transistor drain current to flow. Depletion mode transistors are fabricated with a net negative threshhold voltage. This $V_T$ voltage can be easily adjusted during the manufacturing process by ion-implementation to alter the doping levels.

For the two transistors, there are three parameters that can be selected in accordance with the invention; $V_T$, W and L, to obtain a desired $V_{OUT}$. The threshhold voltages of the transistors $Q_1$ and $Q_2$, after being selected by a designer, usually should not need to be changed. This is because the W/L ratios are more easily adjusted to change the desired value of the output voltage ($V_{OUT}$).

One of the requirements of the circuit shown in FIG. 1 is that $V_{OUT}$ be less than $-V_{T1}$. This requirement is met by making the transistors $Q_1$ and $Q_2$ NMOS depletion mode transistors.

We will now show analytically why the only parameters that need to be selected are W, L and $V_T$ for each transistor to adjust the output voltage $V_{OUT}$. To produce a stable DC voltage, the circuit 10 must operate as follows. $Q_1$ must always be saturated but $Q_2$ can either operate in a saturated or a linear mode. First, let's assume both transistors are operating in saturated modes.

In such a situation $V_{OUT} > V_{T2}$ and $V_{IN} \geqq -V_{T1}$. $Q_2$ forms a constant-current source and the same current flowing through $Q_1$ must also flow through $Q_2$. As a first order of approximation, we will assume that the current $I_{DS2}$ flowing through $Q_2$ is given by the following well known relationship for a field effect transistor operating in saturation.

$$I_{DS2} = \frac{K^1}{2L_2} W_2 (V_{GS2} - V_{T2})^2 \quad (1)$$

where $K^1$ is a constant which depends upon doping and oxide thickness, $L_2$ and $W_2$ are as shown in FIG. 2. Since $V_{GS2} = 0$ $$I_{DS2} = \frac{K^1}{2L_2} V_{T2}^2 \quad (2)$$

As mentioned previously, $I_{DS1} = I_{DS2}$. Also by inspection of FIG. 1, $V_{GS1} = -V_{OUT}$. $I_{DS1}$ is given by eqn. (1) with the subscripts changed. It follows that:

$$\frac{W_1}{2L_1} (-V_{OUT} - V_{T1})^2 = \frac{W_2}{2L_2} V_{T2}^2 \quad (3)$$

$$V_{OUT} = -V_{T1} + V_{T2} \left( \frac{W_2 L_1}{W_1 L_2} \right)^{\frac{1}{2}} \quad (4)$$

It is thus seen from eqn. (4), the only parameters that need be adjusted are $V_T$, L and W for each transistor.

In a similar fashion, if $V_{OUT} < -V_{T2}$, then the transistor $Q_2$ operates in the linear region. The current flowing through transistor $Q_2$ is given by the following well-known relationship:

$$I_{DS2} = \frac{K^1 W_2}{2L_2} [2(V_{GS2} - V_{T2}) V_{DS2} - V_{DS2}^2] \quad (5)$$

Also, $$I_{DS1} = \frac{K^1 W_1}{2L_1} (-V_{OUT} - V_{T1})^2 \quad (6)$$

It can now be shown since $I_{DS1} = I_{DS2}$ that $$V_{OUT} = \frac{-V_{T1} - V_{T2} K2/K1}{1 + K2/K1} - \frac{[(V_{T1} + V_{T2} K2/K1)^2 - (1 + K2/K1) V_{T1}^2]^{\frac{1}{2}}}{1 + K2/K1},$$

where $K2/K1 = W_2 L_1 / L_2 W_1$.

Although eqns. (4) and (6) are based on a simple square-low model for the NMOS transistors, they allow a qualitative understanding of circuit 10. Thus, it is clear that the output voltage is determined solely by the width-to-length ratios and the threshhold voltages of the transistors $Q_1$ and $Q_2$. By using circuit 10, there is a minimum amount of power dissipation and a very small chip area need be used since only two transistors are needed. The circuit 10 is especially suitable for use on-chip with a burried channel CCD imager.

A circuit was constructed where $Q_1$ and $Q_2$ were depletion transistors with W/L ratio parameters of 40 $\mu$m/20 $\mu$m and 10.5 $\mu$m/30 $\mu$m, respectively. The measured voltage threshhold parameters for these transistors were: $V_{T1} = -12.2$ V, and $V_{T2} = -4.74$ V. The input voltage used was a variable 15 V DC. Using eqn. (4), since both $Q_1$ and $Q_2$ are in saturation, the calculated value for $V_{OUT}$ is 10.22 V whereas the measured value was a stable 10.38 V.

The invention has been described in detail with particular reference to a certain preferred embodiment thereof, but it will be understood that variations and modifications can be effected within the spirit and scope of the invention.

I claim:

1. An integrated-circuit which in response to a variable DC input voltage produces a stable DC output voltage, comprising:

a. first and second NMOS depletion mode transistors each having gate, drain and source electrodes electrically connected as follows the source electrode of the first transistor and the drain electrodes of the second transistor being connected, the gate electrodes of both transistors and the source electrode of the second transistor being connected to a reference potential and the drain electrode of the first transistor being connected to the variable DC input voltage; and b. parameters of the first and second transistors being selected so that the desired stable DC voltage is produced at the electrical junction of the connected source and drain electrodes.

2. The invention as set forth in claim 1, wherein both transistors are operated in saturated modes of operation.

3. The invention as set forth in claim 1, wherein the first transistor is operated in the saturated mode and the second transistor is operated in the linear mode.

4. An integrated-circuit which in response to a variable DC input voltage produces a stable DC output voltage, consisting essentially of:

a. first and second NMOS depletion mode transistors each having gate, drain and source electrodes and the following parameters: $V_T$ (threshhold voltage), L (channel length) and W (channel width), the electrodes being electrically connected as follows: the source and drain electrodes of the first and second transistors, respectively, being connected, the gate electrodes of both transistors and the source electrode of the second transistor being connected to ground and the drain electrode of the first transistor being connected to the variable input voltage; and b. the parameters $V_T$, W, and L of the first and second transistors being selected so that the desired stable DC voltage is produced at the electrical junction of the connected source and drain electrodes.

5. The invention as set forth in claim 4, wherein both transistors are operated in saturated modes of operation.

6. The invention as set forth in claim 4, wherein the first transistor is operated in the saturated mode and the second transistor is operated in the linear mode.

* * * * *